(12) United States Patent
Sun et al.

(10) Patent No.: US 11,251,095 B2
(45) Date of Patent: Feb. 15, 2022

(54) HIGH GAIN TRANSISTOR FOR ANALOG APPLICATIONS

(71) Applicant: GLOBALFOUNDRIES Singapore Pte. Ltd., Singapore (SG)

(72) Inventors: Yuan Sun, Singapore (SG); Shyue Seng Jason Tan, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 212 days.

(21) Appl. No.: 15/180,117

(22) Filed: Jun. 13, 2016

(65) Prior Publication Data
US 2017/0358501 A1  Dec. 14, 2017

(51) Int. Cl.
| | |
|---|---|
| *H01L 21/8238* | (2006.01) |
| *H01L 21/8234* | (2006.01) |
| *H01L 29/66* | (2006.01) |
| *H01L 21/266* | (2006.01) |
| *H01L 29/423* | (2006.01) |
| *H01L 29/78* | (2006.01) |

(Continued)

(52) U.S. Cl.
CPC .... *H01L 21/823892* (2013.01); *H01L 21/266* (2013.01); *H01L 21/823418* (2013.01); *H01L 21/823493* (2013.01); *H01L 21/823857* (2013.01); *H01L 29/42364* (2013.01); *H01L 29/6659* (2013.01); *H01L 29/66492* (2013.01); *H01L 29/7833* (2013.01); *H01L 21/823814* (2013.01); *H01L 27/088* (2013.01); *H01L 27/0922* (2013.01)

(58) Field of Classification Search
None
See application file for complete search history.

(56) References Cited

U.S. PATENT DOCUMENTS 6,157,062 A * 12/2000 Vasanth .......... H01L 21/823418
257/204
6,767,780 B2    7/2004 Sohn et al.
(Continued)

FOREIGN PATENT DOCUMENTS

| CN | 1459861 A | 12/2003 |
|---|---|---|
| TW | 577147 B | 2/2004 |

(Continued)

OTHER PUBLICATIONS

Park Systems, Scannning Capacitance Miscroscopy (SCM) High Resolution and High Sensitivity Imaging of Charge Distribution: Characterization of Device with Non-Destructive Technique and High Spatial Resolution, Nanotechnology Solutions Partner, pp. 124-128, Suwon, Korea.

(Continued)

*Primary Examiner* — Abul Kalam
(74) *Attorney, Agent, or Firm* — Thompson Hine LLP; Francois Pagette

(57) ABSTRACT

An analog high gain transistor is disclosed. The formation of the analog high gain transistor is highly compatible with existing CMOS processes. The analog high gain transistor includes a double well, which includes the well implants of the low voltage (LV) and intermediate voltage (IV) transistors. In addition, the analog high gain transistor includes light doped extension regions of IV transistor and a thin gate dielectric of the LV transistor.

9 Claims, 15 Drawing Sheets

(51) Int. Cl.
*H01L 27/088* (2006.01)
*H01L 27/092* (2006.01)

(56) References Cited

U.S. PATENT DOCUMENTS

| | | | |
|---|---|---|---|
| 6,768,174 B2* | 7/2004 | Hasegawa | H01L 21/84 |
| | | | 257/350 |
| 8,753,941 B1* | 6/2014 | Benaissa | H01L 21/823814 |
| | | | 257/358 |
| 2006/0099753 A1 | 5/2006 | Chen et al. | |
| 2007/0054456 A1* | 3/2007 | Misaki | H01L 21/2253 |
| | | | 438/289 |
| 2007/0085137 A1 | 4/2007 | Saitoh et al. | |
| 2007/0105310 A1 | 5/2007 | Chen et al. | |
| 2008/0308878 A1 | 12/2008 | Bulucea | |
| 2013/0241005 A1* | 9/2013 | Shima | H01L 21/823418 |
| | | | 257/401 |
| 2014/0110783 A1* | 4/2014 | Zhang | H01L 21/823814 |
| | | | 257/344 |
| 2014/0206174 A1* | 7/2014 | Chang | H01L 29/66272 |
| | | | 438/424 |

FOREIGN PATENT DOCUMENTS

| | | |
|---|---|---|
| TW | 200731418 A | 8/2007 |
| TW | 200924075 A | 6/2009 |

OTHER PUBLICATIONS

Maria Virginia Stangoni, Scanning Probe Techniques for Dopant Profile Characterization, 2005, pp. 1-171, Zurich, Switzerland.
Chinese Intellectual Property Office, Search Report received in Chinese Patent Application No. 201710441504.0 dated Dec. 17, 2019.
Chinese Intellectual Property Office, Official Action received in Chinese Patent Application No. 201710441504.0 dated Dec. 31, 2019.

* cited by examiner

US 11,251,095 B2

HIGH GAIN TRANSISTOR FOR ANALOG APPLICATIONS

BACKGROUND

Complementary Metal Oxide Semiconductor (CMOS) transistors have been widely employed. For example, CMOS transistors have been employed for analog applications. Analog applications require CMOS transistors with high gains. However, it has been found that current CMOS transistor for analog application suffers high leakage current which limits its application for low power and interne of things (IoT) applications. Furthermore, the output resistance (Rout) of these CMOS transistors used for analog applications is not suitable for short channel devices.

The present disclosure relates to providing CMOS transistors with high gain and improved Rout which are suitable for low power analog and IoT applications.

SUMMARY

Embodiments generally relate to semiconductor devices or integrated circuits (ICs). In one embodiment, a method for forming an analog high gain transistor of a device is disclosed. The method includes forming an analog device on a substrate and forming an analog device well in the device region. The device well includes an analog well dopant concentration which is higher than a dopant concentration of a low voltage (LV) device well for a LV transistor and higher than a dopant concentration of an intermediate voltage (IV) device well for an IV transistor. The method further includes forming an analog gate on the substrate in the device region. The gate includes an analog gate electrode over an analog gate dielectric. The analog gate dielectric is a thin gate dielectric used for the LV transistor. Analog source drain (S/D) regions in the device well in the substrate adjacent to the analog gate. A S/D region comprises a heavily doped main region and an analog lightly doped extension region. The analog lightly doped extension region includes a dopant concentration of an IV lightly doped extension region for an IV transistor. The higher dopant concentrations of the analog device well, the thin gate dielectric of the analog gate, and the IV lightly doped extension region of the analog S/D regions increase performance of the analog high gain transistor.

In another embodiment, an analog high gain transistor of a device is disclosed. The analog high gain transistor includes an analog device region on a substrate and an analog device well in the device region. The device well includes a well dopant concentration which is higher than a low voltage (LV) dopant concentration of a LV device well for a LV transistor or an intermediate voltage (IV) dopant concentration of an IV device well for an IV transistor. The transistor further includes an analog gate on the substrate in the device region. The gate includes an analog gate electrode over an analog gate dielectric. The analog gate dielectric is a thin gate dielectric used for the LV transistor. The transistor further includes analog source drain (S/D) regions adjacent to the analog gate, where a S/D region includes a heavily doped main region and an analog lightly doped extension region. The analog lightly doped extension region includes a dopant concentration of an IV lightly doped extension region for an IV transistor. The higher dopant concentrations of the analog device well, the thin gate dielectric of the analog gate, and the IV lightly doped extension region of the analog S/D regions increase performance of the analog high gain transistor.

In yet another embodiment, a method for forming a device is disclosed. The method includes forming a low voltage (LV) device region on a substrate with a LV device well for a LV transistor. The LV device well includes a LW well dopant concentration. An intermediate (IV) device region on a substrate with an IV device well for an IV transistor is also formed. The IV device well includes an IV well dopant concentration. The method further includes forming an analog device region on a substrate with an analog device well for an analog transistor. The analog device well includes an analog well dopant concentration which is higher than the LV device well dopant concentration or the IV well dopant concentration. The method further includes forming the LV transistor in the LV device region. The LV transistor includes a LV gate having a LV gate electrode over a LV gate dielectric which is a thin gate dielectric and LV S/D regions adjacent to the LV gate. A LV S/D region includes a LV heavily doped main S/D region and a LV extension region having a LV extension dopant concentration. The IV transistor is formed in the IV device region. The IV transistor includes an IV gate having an IV gate electrode over an IV gate dielectric which is an intermediate gate dielectric with a thickness greater than the thin gate dielectric. The IV transistor further includes IV S/D regions adjacent to the IV gate. An IV S/D region includes an IV heavily doped main S/D region and an IV extension region having an IV extension dopant concentration which is lower than the LV extension dopant concentration. The method further includes forming the analog high gain transistor in the analog device region. The analog high gain transistor includes an analog gate having an analog gate electrode over an analog gate dielectric with the same thickness as the thin gate dielectric and analog S/D regions adjacent to the analog gate. The analog S/D region includes an analog heavily doped main S/D region and an analog extension region having an analog extension dopant concentration which is lower than the LV extension dopant concentration.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices or integrated circuits (ICs). More particularly, some embodiments relate to high gain devices. For example, high gain devices include transistors, such as metal oxide transistors (MOS). The high gain devices can be employed in analog applications, such as high DC gain amplifier, audio amplifier or audio Codex. The high gain transistors can be easily integrated into devices or ICs with core and input/output (I/O) transistors. The devices or ICs can be incorporated into or used with, for example, various types of consumer electronic products.

Figure 1:
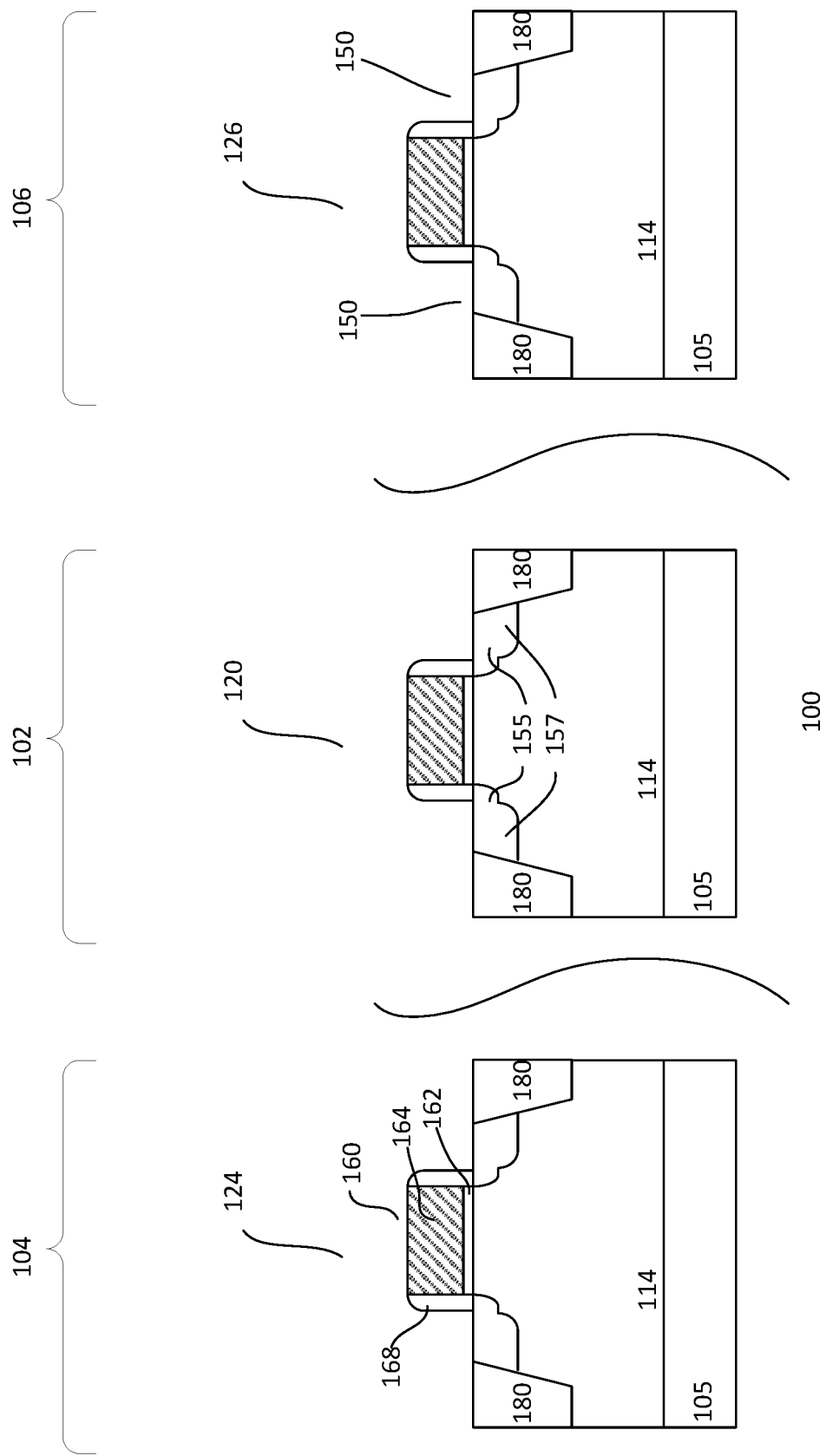
FIG. 1 shows cross-sectional view of a portion of an embodiment of a device.

FIG. 1 shows a cross-sectional view of a portion of an embodiment of a device 100. The device, for example, is an IC. Other types of devices may also be useful. As shown, the device includes a substrate 105. The substrate, for example, is a silicon substrate. Other types of substrates, such as silicon germanium, germanium, gallium arsenide, or crystal-on-insulator (COI) such as silicon-on-insulator (SOI), are also useful. The substrate may be a doped substrate. For example, the substrate can be lightly doped with p-type dopants. Providing a substrate with other types of dopants or dopant concentrations, as well as an undoped substrate, may also be useful.

The device may include doped regions having different dopant concentrations. For example, the device may include heavily doped ($x^+$), intermediately doped (x) and lightly doped ($x^-$) regions, where x is the polarity type which can be p or n. A lightly doped region may have a dopant concentration of about $1E15$-$1E17/cm^3$, an intermediately doped region may have a dopant concentration of about $1E17$-$1E19/cm^3$, and a heavily doped region may have a dopant concentration of about $1E19$-$1E21/cm^3$. Providing other dopant concentrations for the different types of doped regions may also be useful. For example, the ranges may be varied, depending on the technology node. In addition, the ranges may vary based on the type of transistors or devices, such as high voltage, intermediate voltage or low voltage transistors. P-type dopants may include boron (B), aluminum (Al), indium (In) or a combination thereof, while n-type dopants may include phosphorous (P), arsenic (As), antimony (Sb) or a combination thereof.

The substrate includes various device regions. For example, as shown, the substrate includes first, second and third device regions 102, 104 and 106 for first, second and third transistors 120, 124 and 126. In one embodiment, the first device region 102 serves as a device region for an analog high gain (AHG) transistor 120, the second device region 104 serves as a device region for a core transistor 124, such as a low voltage (LV) transistor, and the third device region 106 serves as a device region for an intermediate voltage (IV) transistor, such as an input/output (I/O) transistor 126. The device may include other device regions. Other configurations of device regions may also be useful. For example, the device may include a high voltage (HV) region for a HV transistor or a memory array region for memory cells.

Isolation regions may be provided for isolating or separating different regions of the substrate. In one embodiment, the device regions are isolated from other regions by isolation regions 180. For example, an isolation region surrounds a device region. The isolation regions, for example, are shallow trench isolation (STI) regions. Other types of isolation regions may also be employed. For example, the isolation regions may be deep trench isolation (DTI) regions. The STI regions, for example, extend to a depth of about 2000-5000 Å. Providing isolation regions which extend to other depths may also be useful.

A device well 114 may be disposed in a device region. For example, the first, second and third device regions include first, second and third device wells. In one embodiment, the first device region 102 includes an AHG transistor or device well 114, the second device region 104 includes a LV transistor well 114 and the third device region 106 includes an IV transistor well 114. A device well, for example, encompasses the device region. The device well may have a depth of about 0.5-5 µm. Other depths for the device wells may also be useful.

A device well is a second polarity type doped well which serves as a body for a first polarity type device. For example, a p-type device well is provided for a n-type transistor or a n-type device well is provided for a p-type transistor. In some cases, a device well may be provided by the starting substrate. For example, if the starting substrate includes the appropriate doping type and concentration, it may serve as a device well. The dopant concentration of the device wells may be light to intermediate. In one embodiment, the different types of device wells have different dopant concentrations. For example, the AHG, LV and IV transistor wells have different dopant concentrations.

In one embodiment, even though the LV and IV wells may be referred to as lightly or intermediately doped wells, the LV transistor well has a higher dopant concentration than the IV transistor well. For example, lightly or intermediately doped LV transistor well has a higher dopant concentration relative to the lightly or intermediately IV doped transistor well. For example, the dopant concentration of the LV transistor well is about $1E16/cm^3$ while the dopant concentration of the IV transistor well is about $5E15/cm^3$. Other dopant concentrations for the wells may also be useful. The LV and IV wells may have similar dopant profiles except that the dopant concentration for the LV well is higher than the IV well.

As for the AHG well, it is provided with the highest dopant concentration of the three types of wells. For example, the lightly or intermediately doped AHG well has a higher dopant concentration than either the LV or IV well. The dopant concentration of the AHG well may be about $1.5E16/cm^3$. Providing other dopant concentrations may also be useful. In one embodiment, the AHG well has the combined dopant concentrations of the LV and IV wells. For example, the AHG well is a double well having dopants from forming the LV well as well as the IV well. The AHG well may be formed by the LV implant which forms the LV well and the IV implant which forms the IV well. Alternatively, the AHG well may be formed by an AHG implant, using an AHG implant mask.

A gate 160 of a transistor is disposed on the substrate surface in the device region. For example, the gate is disposed over the device well. In one embodiment, an AHG gate is disposed over the substrate in the first device region, a LV gate is disposed over the substrate in the second device region and an IV gate is disposed over the substrate in the third device region. A gate includes a gate electrode 164 over a gate dielectric 162. For example, the AHG gate includes an AHG gate electrode over an AHG gate dielectric, the LV gate includes a LV gate electrode over a LV gate dielectric and the IV gate includes an IV gate electrode over an IV gate dielectric. The gate electrode, for example, may be polysilicon while the gate dielectric may be silicon oxide. Other types of gate electrodes or gate dielectrics may also be useful. For example, the gate electrode may be a metal gate electrode and the gate dielectric may be a high k gate dielectric. High voltage transistors may include thick gate dielectrics which is thicker than the intermediate gate dielectrics.

In one embodiment, the AHG gate dielectric and the LV gate dielectric are thin gate dielectrics. For example, the AHG and LV gate dielectrics are dielectric layers used for LV transistors. As for the IV gate dielectric, it is a thicker or intermediate gate dielectric. For example, the thicker gate dielectric is a dielectric layer used for IV transistors. The intermediate gate dielectric is thicker relative to the thin gate dielectrics since high breakdown voltage (BV) is needed. For example, a thin gate dielectric may be about 20 Å thick while an intermediate gate dielectric may be about 60 Å thick. Other relative thicknesses for the gate dielectrics may also be useful.

Dielectric sidewall spacers 168 are disposed on sidewalls of the gate. The sidewall spacers, for example, may be silicon oxide. Other types of dielectric materials or combination of materials may be used for the spacers. It is understood that the LV, AHG and IV gates need not be the same type of gates. For example, the various components of the LV, AHG and IV gates may be formed of different materials or have different configurations.

A transistor includes first and second source/drain (S/D) regions 150 disposed in the device well adjacent to the first and second sides of the gate. In one embodiment, a S/D region includes a main S/D region 157 and an extension S/D region 155. The main and extension regions are first polarity type doped regions. The main region is a heavily doped region while the extension region is a lightly doped region. The extension S/D region may be referred to as a lightly doped drain (LDD) extension region. As shown, the main S/D region is disposed adjacent to about an outer edge of the dielectric sidewall spacer and the gate overlaps the extension region. The gate, for example, overlaps the extension region by about 10 Å. Overlapping the extension region by other distances may also be useful.

In one embodiment, the AHG transistor includes AHG S/D regions with AHG main and AHG extension regions, the LV transistor includes LV S/D regions with LV main and LV extension regions and the IV transistor includes IV S/D regions with IV main and IV extension regions. The dopant concentration of the heavily doped main regions may be about 1E20/cm$^3$. Other dopant concentrations for the main regions may also be useful.

As for the extension regions, the different types of transistors may have different dopant concentrations. In one embodiment, a LV extension region has a higher dopant concentration relative to an IV extension region. For example, a LV extension region has a dopant concentration of about 1E18/cm$^3$ while an IV extension region has a dopant concentration of about 1E17/cm$^3$. Other dopant concentrations for the extension regions may also be useful. The LV S/D regions include halo regions. For example, second polarity type halo regions are adjacent to the LV extension regions. The halo regions suppress lateral diffusion of the LV extension regions. The IV S/D regions are not provided with halo regions.

In one embodiment, an AHG extension region is the same as an IV extension region. For example, the AHG transistor has a gate dielectric which is tailored as if it were a LV transistor, but has an extension region which is tailored as if it were an IV transistor. The AHG extension region may have a dopant concentration of about 1E17/cm$^3$. Providing the AHG extension region with other dopant concentrations may also be useful. The AHG S/D regions, similar to the IV S/D regions, do not include halo regions.

A channel of the transistors is disposed below the gate and between the S/D regions. A channel length is the distance between the S/D regions and a channel width is the distance between sides of the active region perpendicular to the length direction. In one embodiment, the LV transistor includes smaller channel length and channel width relative to the IV or AHG transistor. For example, the IV or AHG transistor has a larger length and width relative to the LV transistor. In one embodiment, the IV and AHG transistors have the same or similar channel widths and lengths. Other configurations for channel lengths and widths of the transistors may also be useful. The overall height of the gates of the IV, LV and AHG transistors may be about the same. For example, the height for the IV gate may be slightly higher due to the thicker gate dielectric. Providing the gates with the same height may also be useful. For example, a planarization process may be performed to create the same gate heights.

In some embodiments, a dielectric etch stop layer (not shown) is formed over the transistors. The etch stop layer, for example, is a silicon nitride etch stop layer. Other types of etch stop layers may also be useful. The etch stop layer should have a material which can be selectively removed from a dielectric layer thereover. The etch stop layer facilitates in forming contact plugs to contact regions of the transistor, such as the gate electrode and doped regions. In some embodiments, the etch stop layer may also serve as a stress layer for applying a stress on the channel of the transistor to improve performance.

Metal silicide contacts (not shown) may be formed on the S/D regions and on the gate electrodes. The metal silicide contacts, for example, may be nickel-based contacts. Other types of metal silicide contacts may also be useful. For example, the metal silicide contact may be cobalt silicide (CoSi). The silicide contacts may be about 50-300 Å thick. Other thicknesses may also be useful. The metal silicide contacts may be employed to reduce contact resistance and facilitate contact to the back-end-of-line metal interconnects. For example, a dielectric layer (not shown) may be provided over the transistors. Via contacts, such as tungsten contacts, may be formed in the dielectric layer coupling the contact regions of the transistors to metal lines disposed in metal layers of the device.

The gain of the device is defined by the following equation:

$$\text{Gain} = G_m \times R_{out}$$

where
  $G_m$=transconductance, and
  $R_{out}$=output resistance.

By combing the implants which are used to form both LV and IV wells, the AHG well has a more uniform channel dopant profile. This suppresses short channel effect and channel pitch-off, which contributes to better $R_{out}$ of the AHG transistor. In addition, the AHG well lowers channel leakage for the AHG transistor.

Figure 2A:
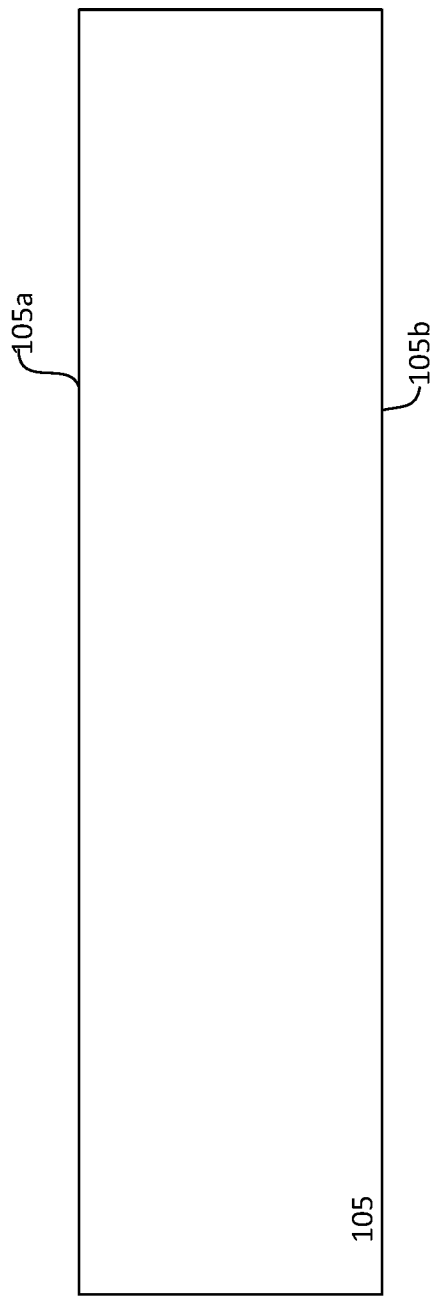
FIGS. 2a-2n show cross-sectional views of an embodiment of a process for forming a device.
Figure 2B:
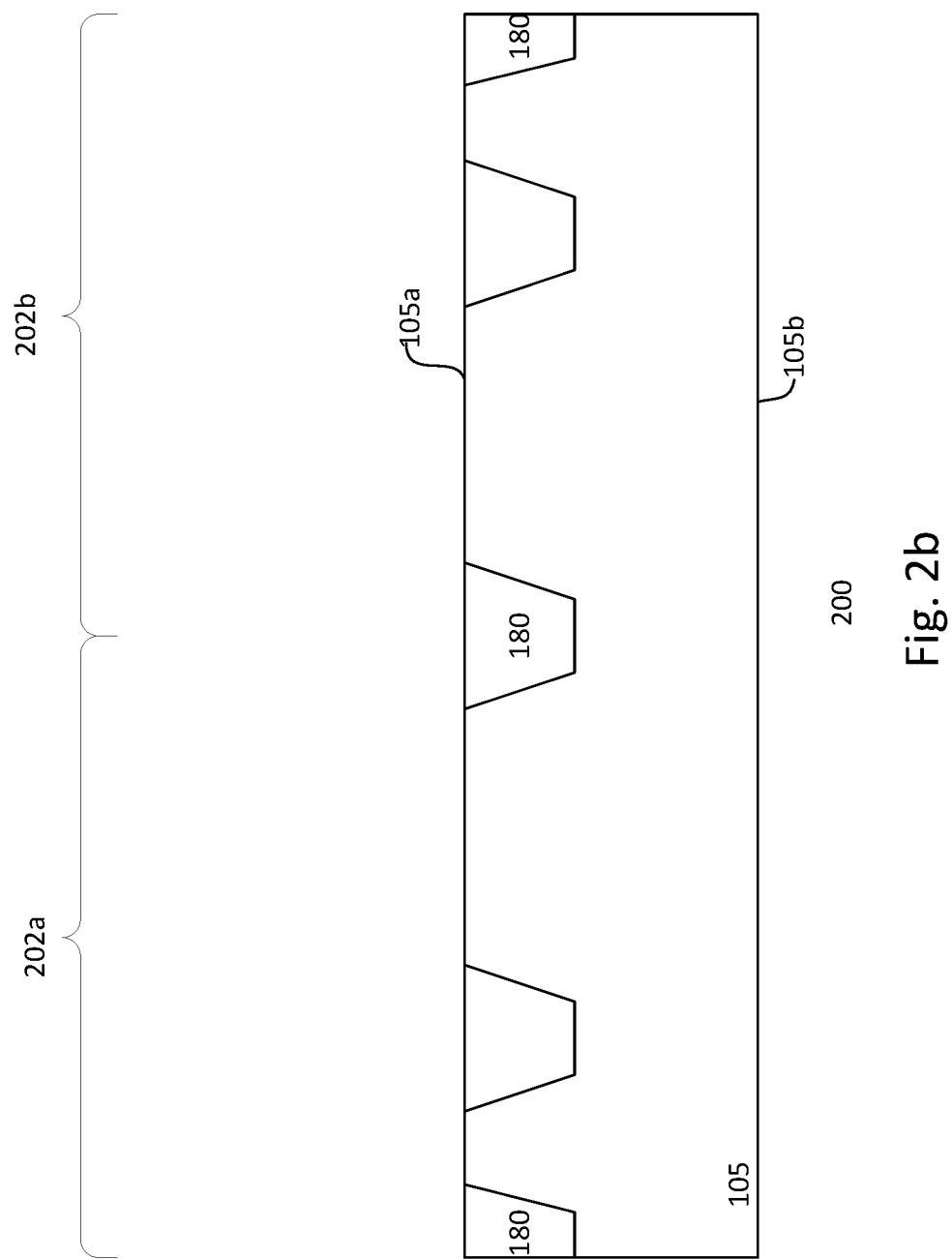
Figure 2C:
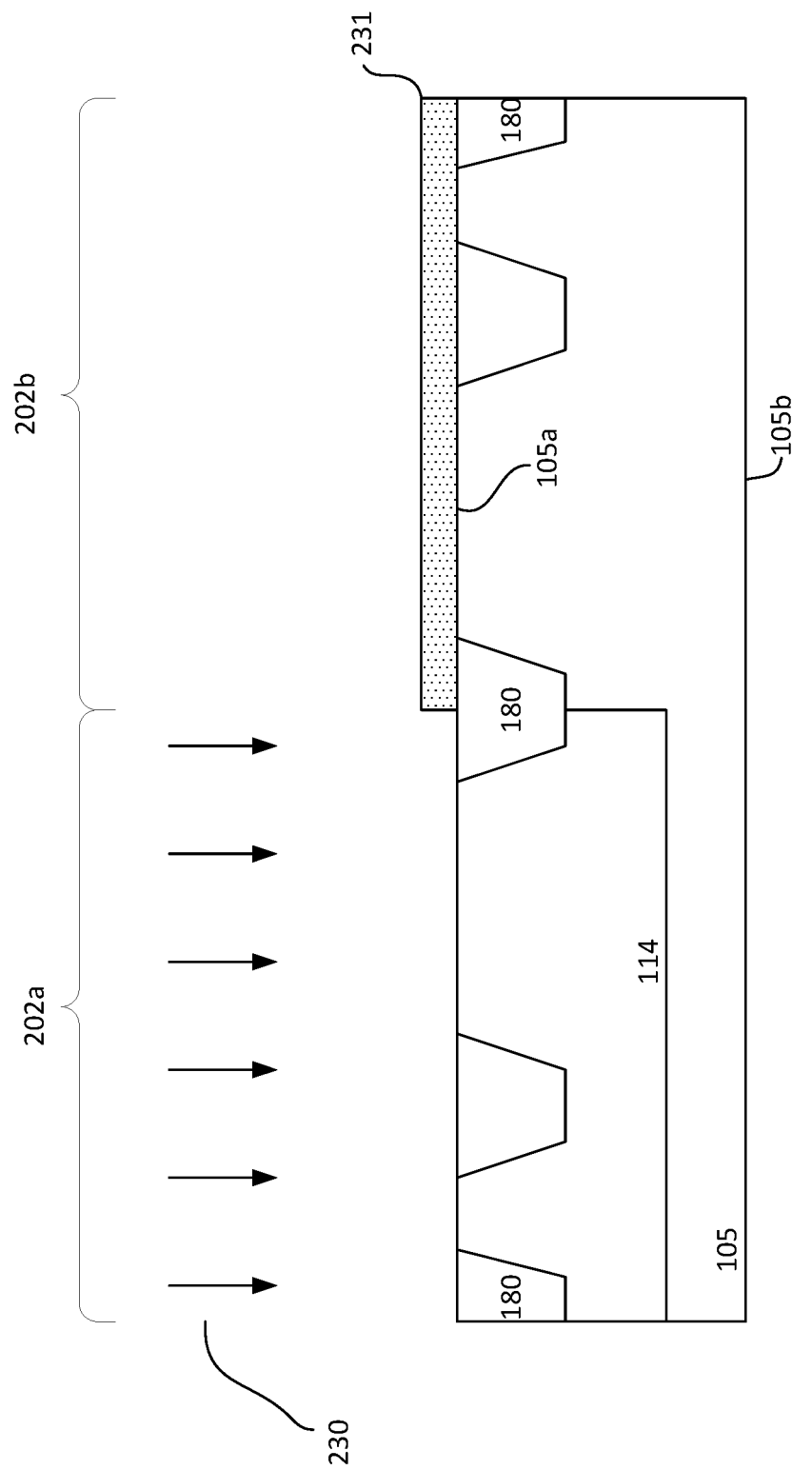
Figure 2D:
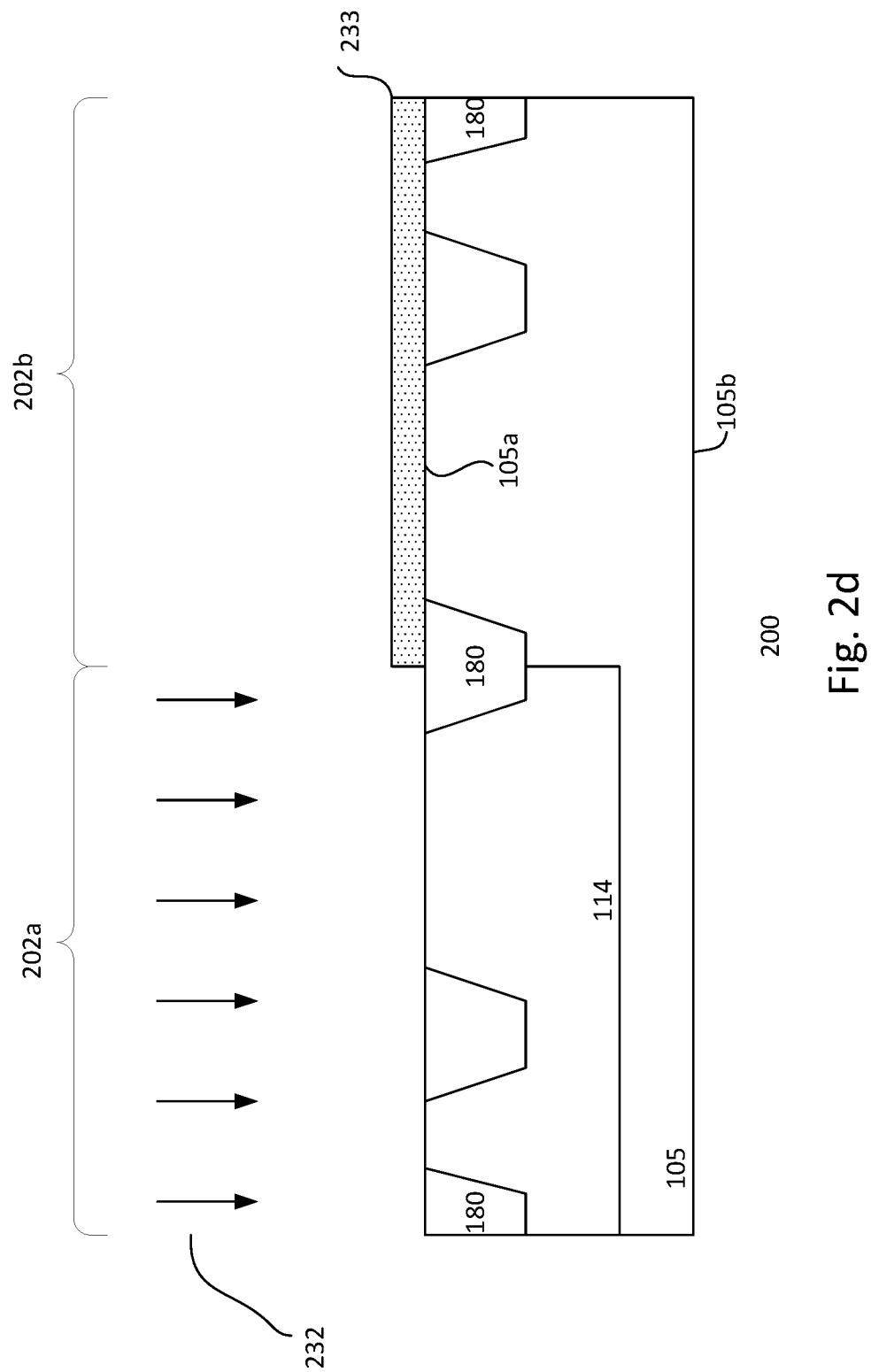
Figure 2E:
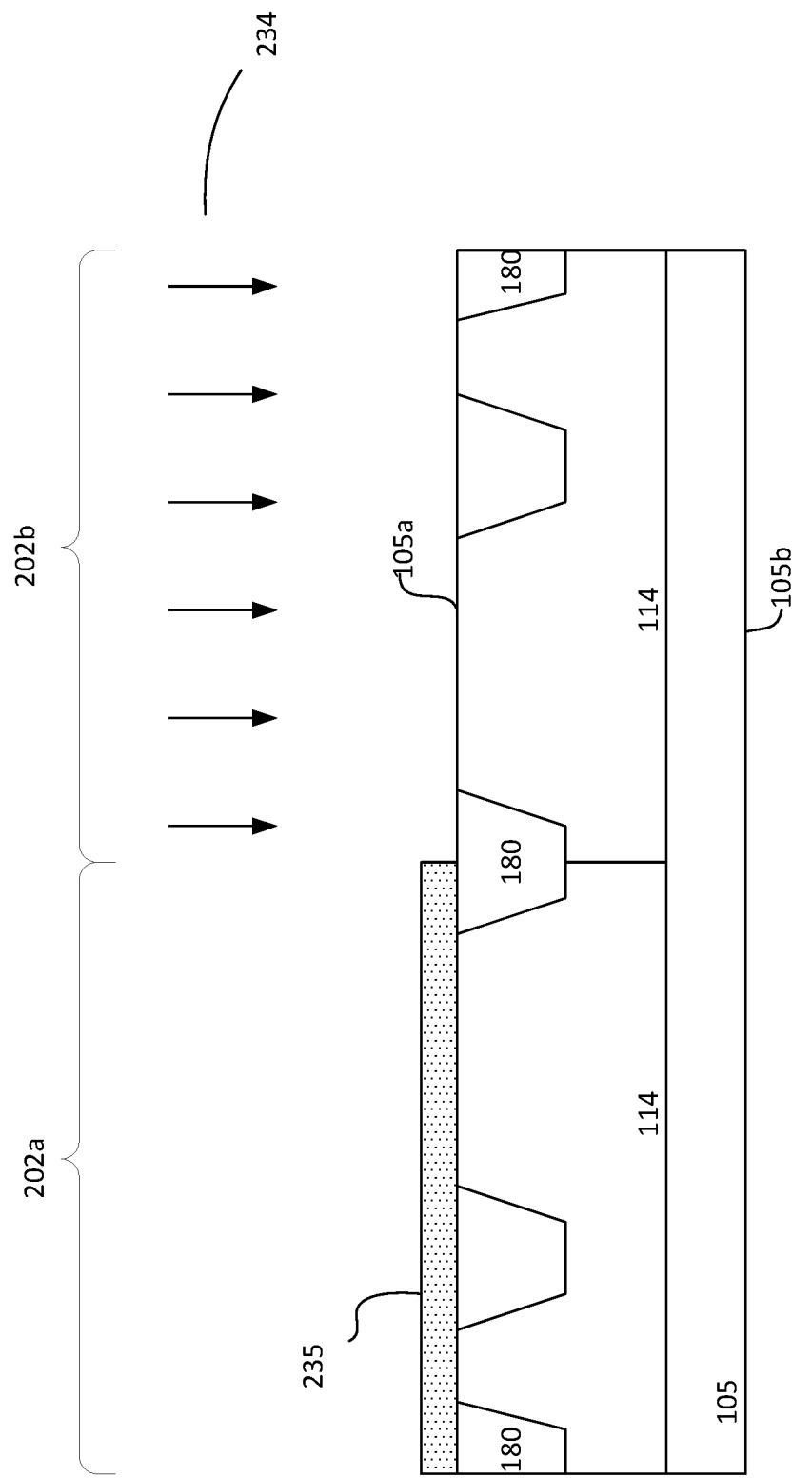
Figure 2F:
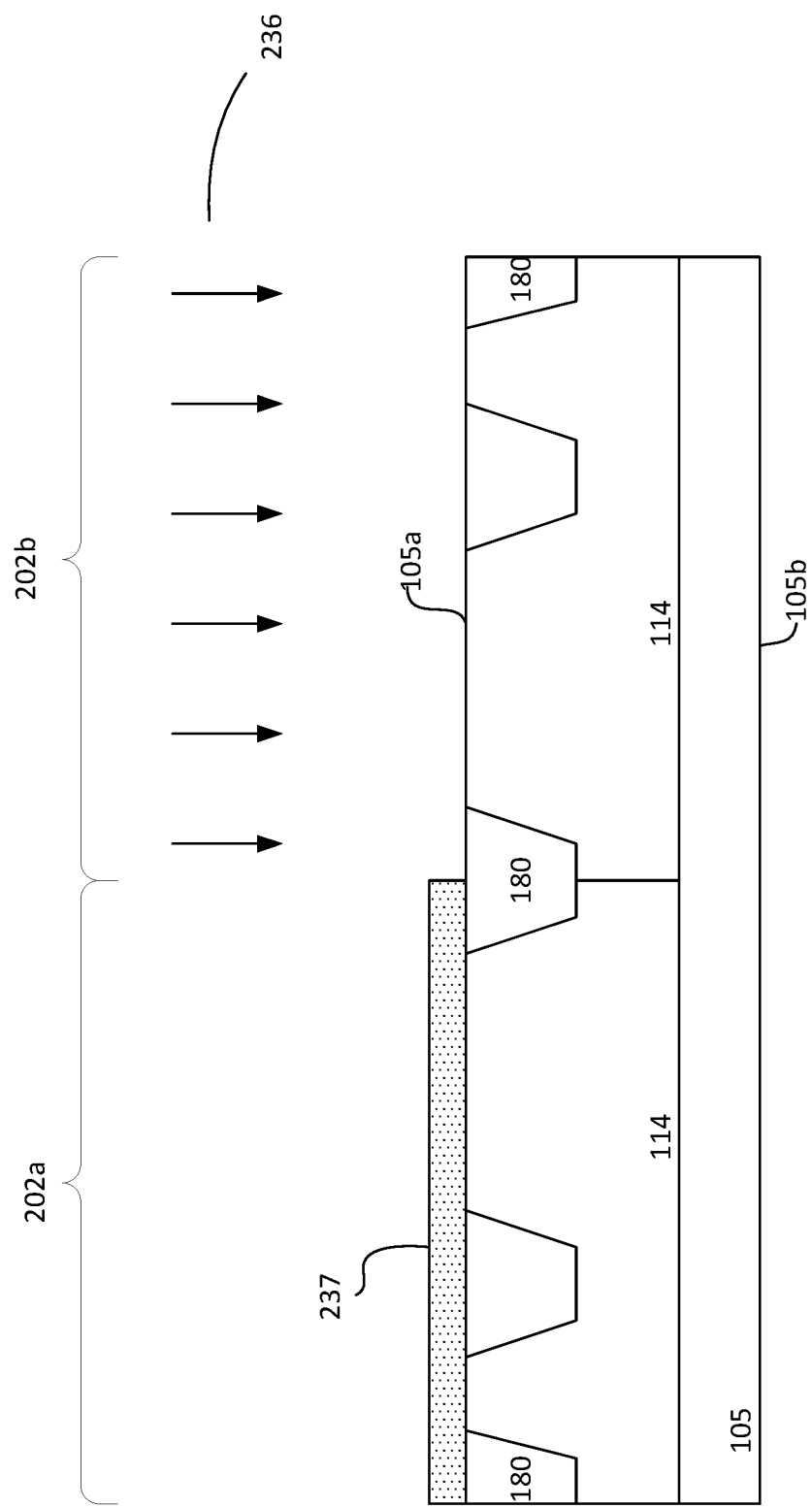
Figure 2G:
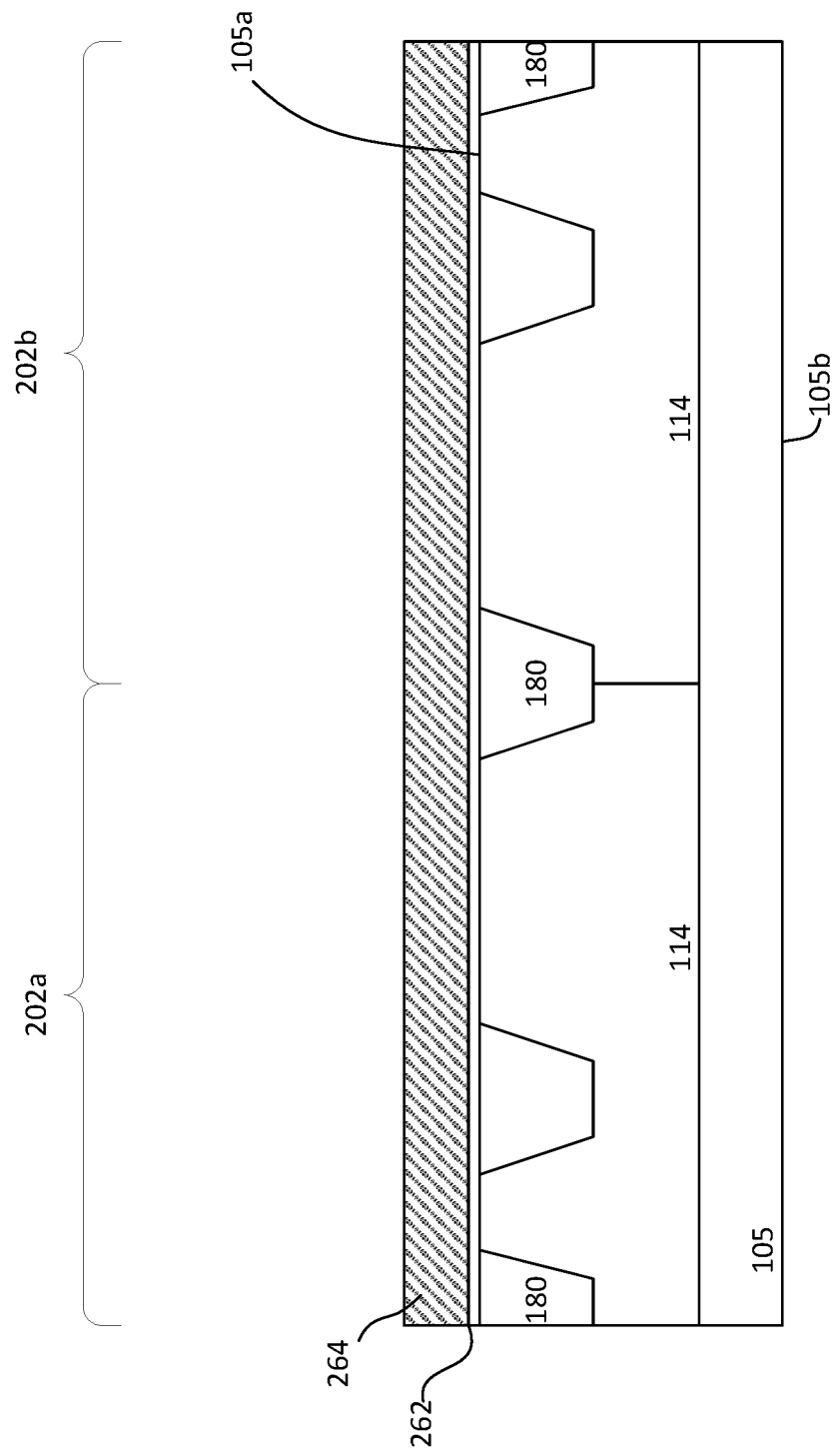
Figure 2H:
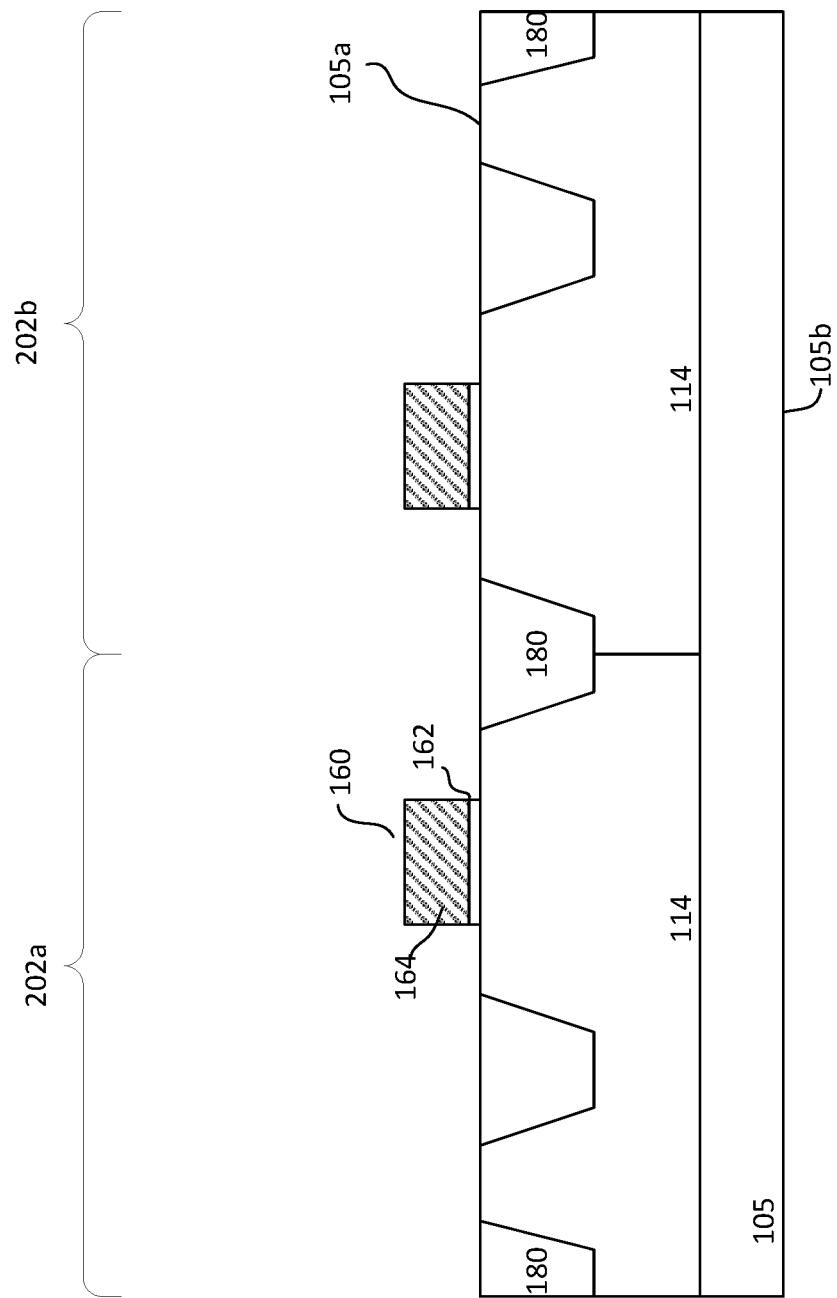
Figure 2I:
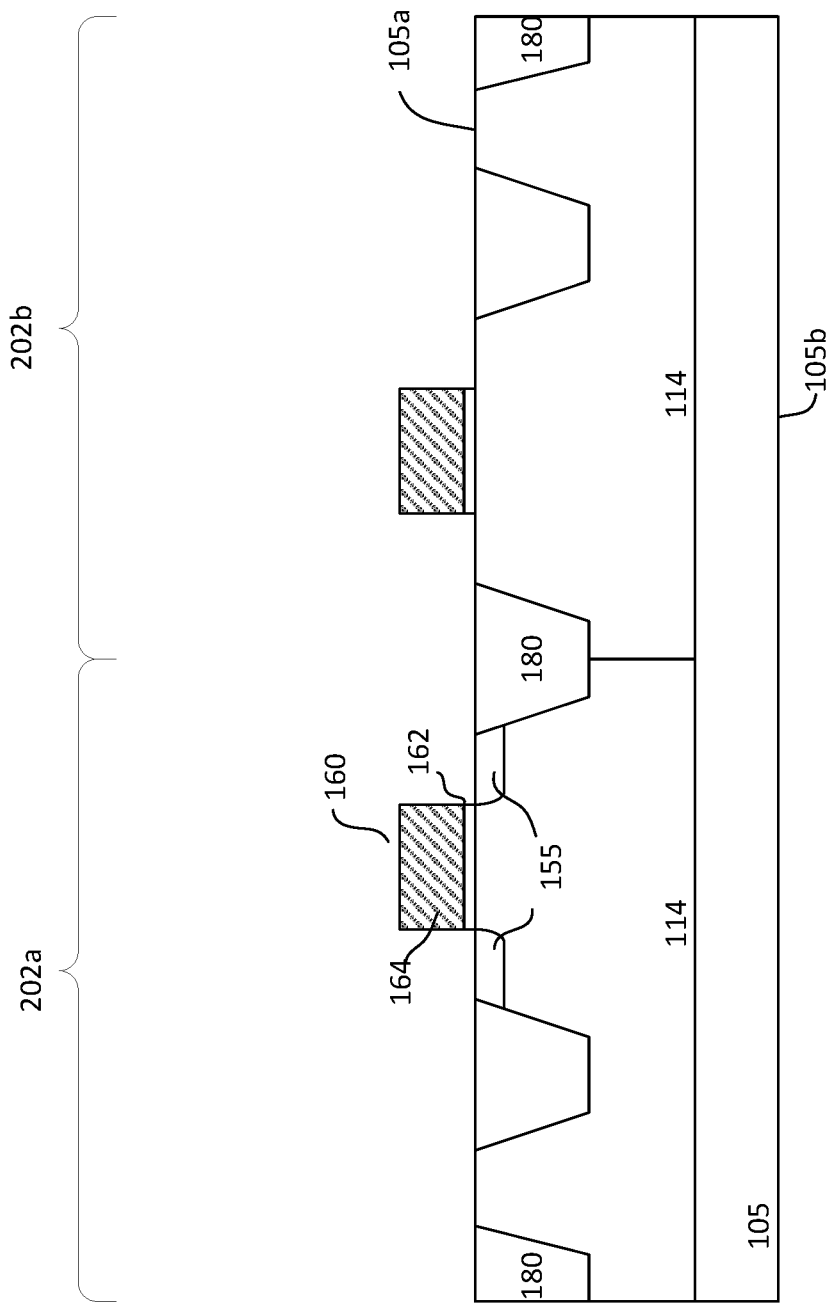
Figure 2J:
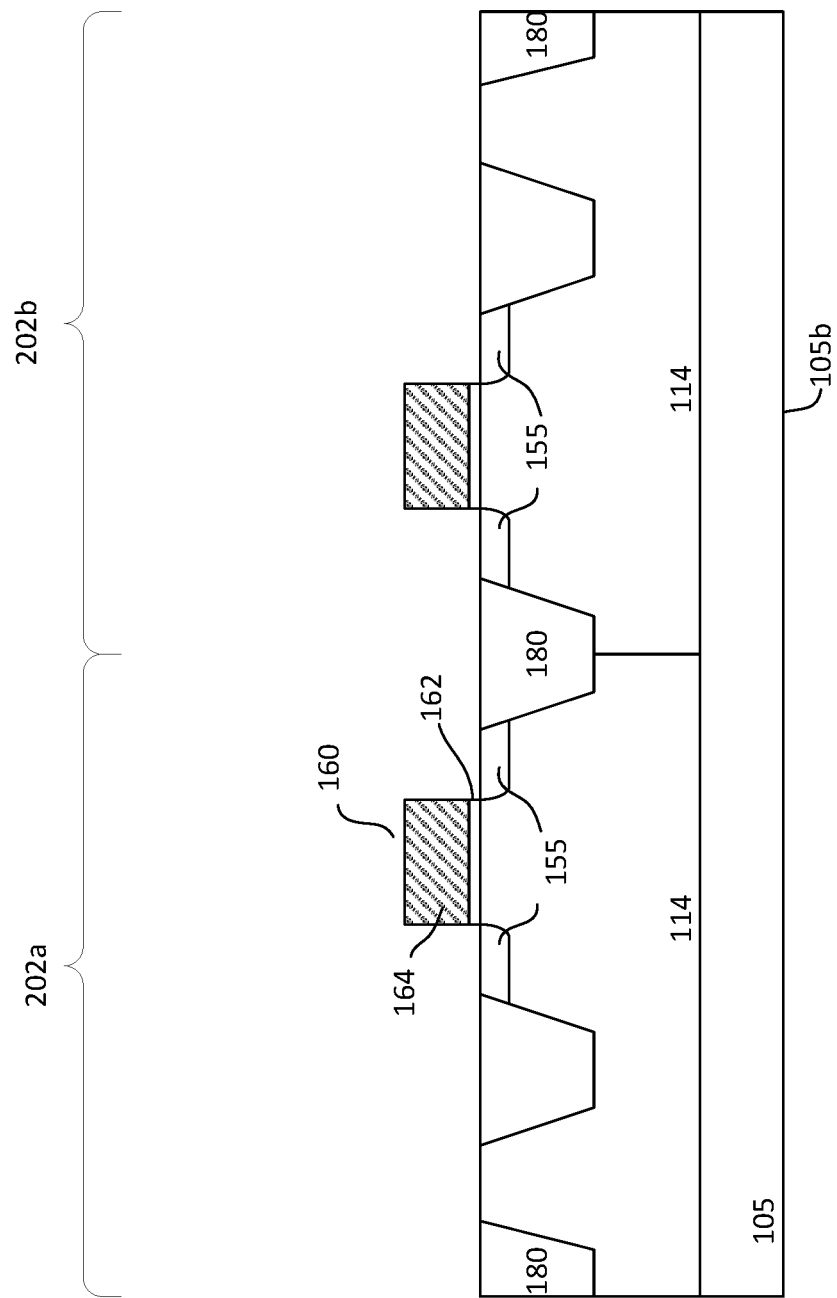
Figure 2K:
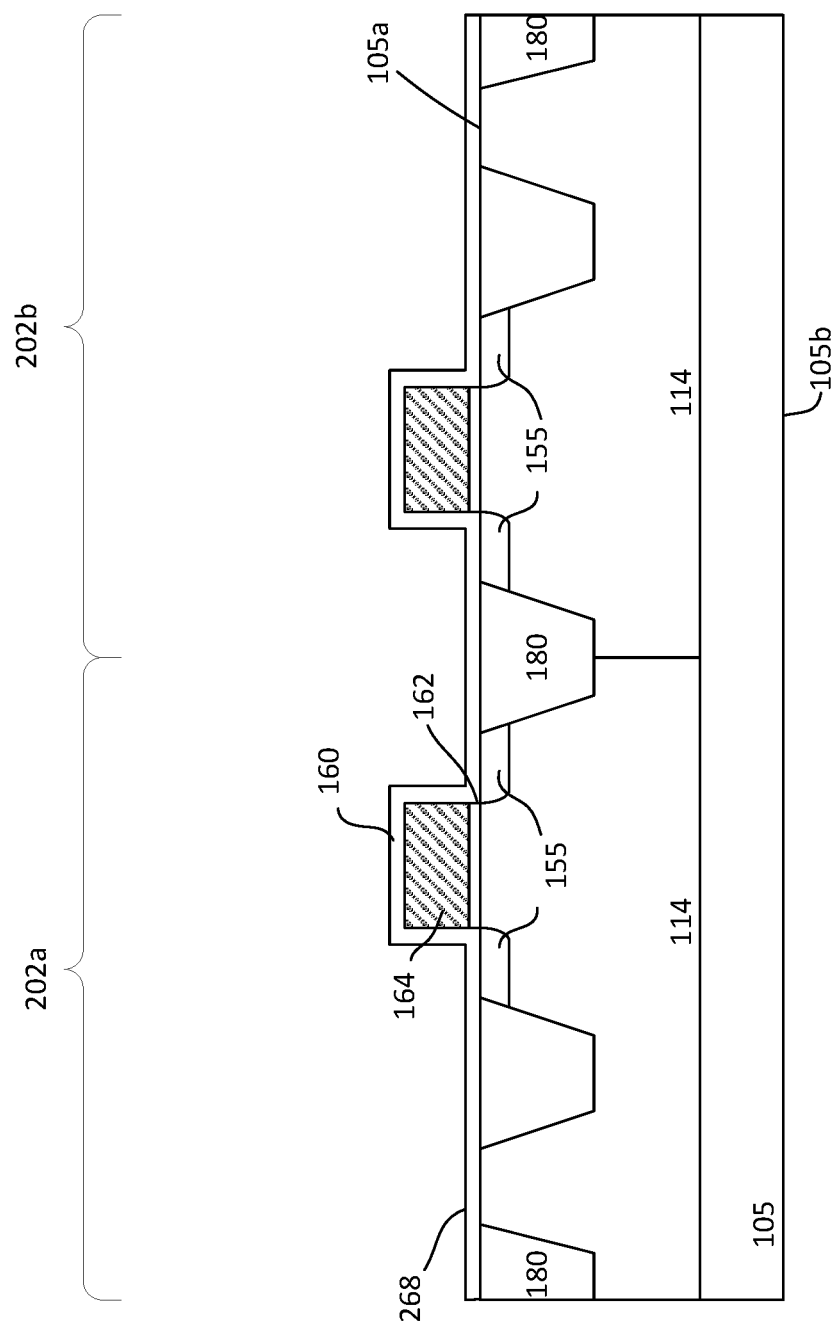
Figure 2I:
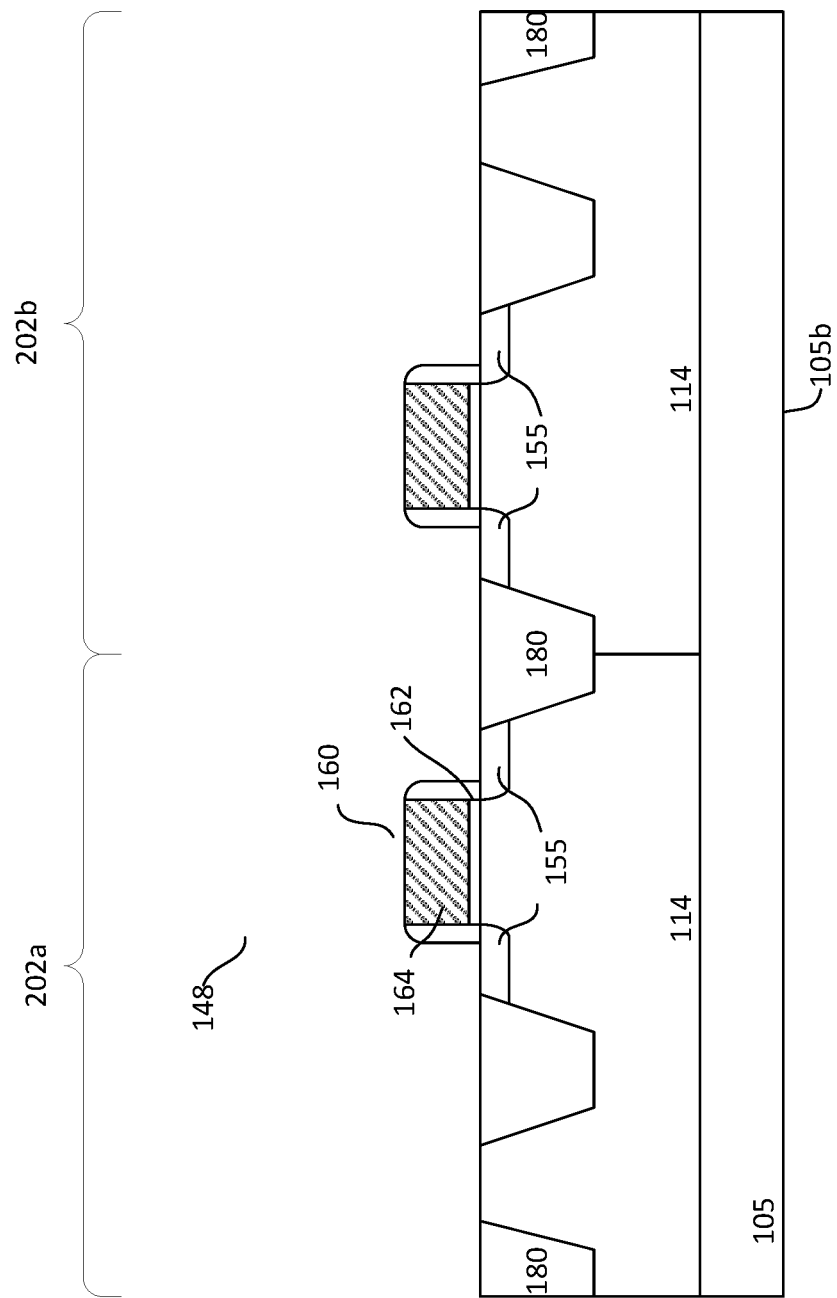
Figure 2M:
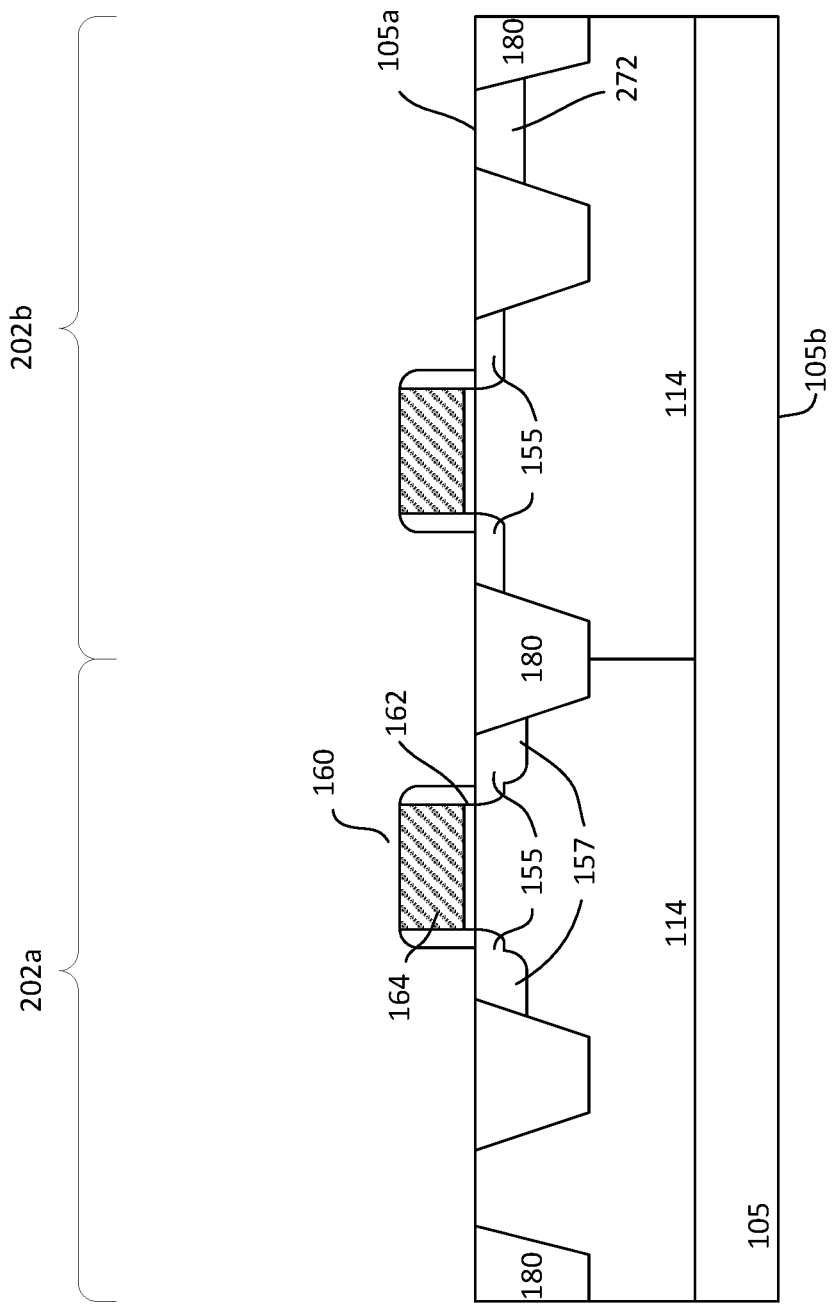
Figure 2N:
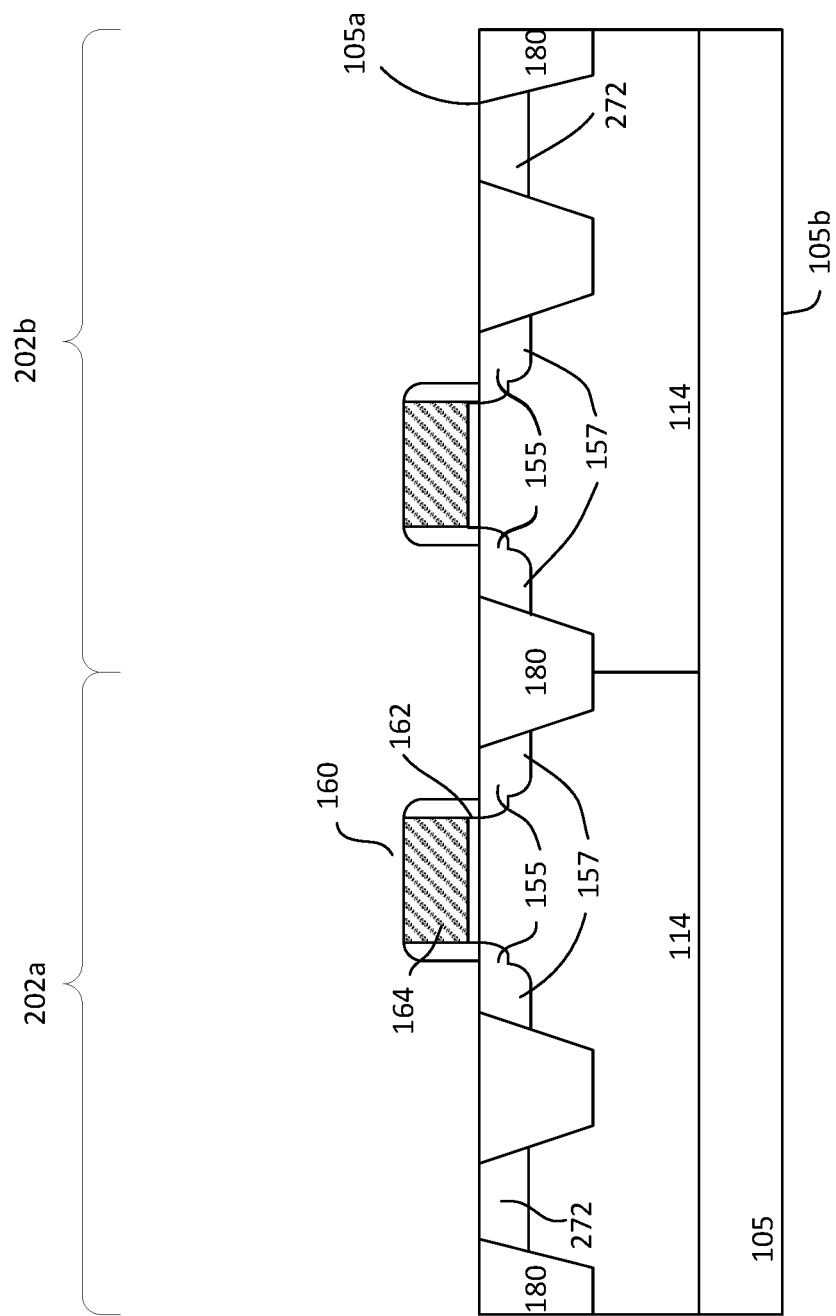

FIGS. 2a-2n show cross-sectional views of an embodiment of a process 200 for forming a device. Referring to FIG. 2a, a substrate 105 is provided. The substrate includes first and second major surfaces 105a and 105b. The substrate, in one embodiment, is a silicon substrate. The substrate may be a doped substrate, such as a lightly doped p-type (p) substrate. Other types of substrates, such as a germanium-based, gallium arsenide, COI such as SOI, or sapphire, may also be useful. The substrate may be doped with other types of dopants or dopant concentrations.

Referring to FIG. 2b, the substrate is processed to define first and second device regions 202a-202b. Defining the device regions include forming isolation regions 180. The isolation regions may be STI regions. A STI region, for example surrounds a device region. Other types of isolation regions may also be useful. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STIs. The depth of the STI regions may be, for example, about 2000-5000 Å. Other depths for the STI regions may also be useful.

The first device region 202a may serve as a device region for a first type AHG transistor and the second device region 202b may serve as a device region for a second type AHG transistor of a CMOS device. For example, the first device region is for a n-type AHG transistor and the second device region is for a p-type AHG transistor. The substrate may include other types of device regions, such as LV and IV transistor regions.

In FIG. 2c, a device well 114 is formed in the first device region. The device well is a second polarity type device well for a first polarity type AHG transistor. For example, the device well is a p-type well for a n-type AHG transistor. Forming a n-type well for a p-type AHG transistor may also be useful. In one embodiment, the device well is a lightly or intermediately doped second polarity type device well. For example, second polarity type dopants are implanted into the substrate to form the device well in the first device region.

In one embodiment, the device well is formed by multiple ion implantation processes. As shown, a first implant mask 231 is provided on the substrate. The implant mask, for example, is a photoresist layer patterned by exposing it with an exposure source through a reticle. To improve lithographic resolution, an anti-reflective coating (ARC) may be used below the photoresist layer. The pattern on the reticle is transfer to the resist after development. For example, the implant mask over the first device region is removed, leaving it covering the second device region. A first implant 230 implants second polarity type dopants into the substrate. In one embodiment, the first implant is the same implant used to form second polarity type LV transistor wells. For example, the first implant mask also exposes device regions for first polarity type LV transistors. After the implant, the mask is removed. For example, the implant mask is removed by ashing. Other techniques for removing the implant mask may also be useful.

A second implant 232 is performed, as shown in FIG. 2d. The second implant employs a second implant mask 233, such as a patterned photoresist mask. The second implant implants second polarity type dopants into the substrate. In one embodiment, the second implant is the same implant used to form second polarity type IV transistor wells. For example, the second implant mask also exposes device regions for first polarity type IV transistors. After the implant, the mask is removed by, for example, ashing. The second implant completes forming the second polarity type AHG transistor well for a first polarity type AHG transistor.

Referring to FIG. 2e, a device well 114 is formed in the second device region. The device well is a first polarity type device well for a second polarity type AHG transistor. For example, the device well is a n-type well for a p-type AHG transistor. Forming a p-type well for a n-type AHG transistor may also be useful. In one embodiment, the device well is a lightly or intermediately doped first polarity type device well. For example, first polarity type dopants are implanted into the substrate to form the device well in the second device region.

Similar to the device well in the first device region, the device well in the second device well is formed by multiple ion implantation processes. A patterned implant mask 235 is provided on the substrate, covering the first device region while exposing the second device region. An implant 234 (first implant for second device region) implants first polarity type dopants into the substrate. In one embodiment, the implant is the same implant used to form first polarity type LV transistor wells. For example, the implant mask also exposes device regions for second polarity type LV transistors. After the implant, the mask is removed by, for example, ashing.

Another implant 236 (second implant for second device region) is performed, as shown in FIG. 2f. The implant employs an implant mask 237, such as a patterned photoresist mask. The implant implants first polarity type dopants into the substrate. In one embodiment, the implant is the same implant used to form first polarity type IV transistor wells. For example, the implant mask also exposes device regions for second polarity type IV transistors. After the implant, the mask is removed by, for example, ashing. The two implants for the second device region completes forming the first polarity type AHG transistor well for a second polarity type AHG transistor. After the wells are formed, an annealing process may be performed to activate the well dopants. The annealing process may be performed directly after the formation of the wells or at other stages of processing, such as after forming the S/D regions.

Although the AHG wells, as described, are formed in a specific implant sequence, it is understood that other implant sequences may be used. Furthermore, it is understood that other wells may be formed on the substrate, depending on the type of device. As described, the AHG wells can be integrated into current processes cost free. For example, the AHG wells can be integrated into current processes with no additional mask required.

In some embodiments, the device wells may be formed by specific implants tailored for the AHG transistors. For example, separate implants may be tailored specifically for the first polarity and second polarity AHG transistor wells. Other techniques or processes for forming the AHG wells may also be useful. However, this may require additional masks.

Referring to FIG. 2g, gate layers of the gates are formed on the substrate. In one embodiment, the gate layers include a gate dielectric layer 262 on the substrate and a gate electrode layer 264 formed thereon. In one embodiment, the gate dielectric layer is silicon oxide. The gate dielectric layer, in one embodiment, is a thin gate dielectric layer. For example, the gate dielectric layer is the same as that used for LV transistors. The thickness of the gate dielectric layer, for example, may be about 20 Å. Other thicknesses may also be useful. The gate dielectric layer may be formed by thermal oxidation. For example, the dielectric layer is formed by wet oxidation followed by annealing the substrate in an oxidizing ambient. The temperature of the wet oxidation can be, for example, about 600-900° C. The annealing process can be, for example, performed at a temperature of about 600-1000° C. Forming other types of gate dielectric layers or using other processes may also be useful.

The substrate may include dielectrics for other types of devices, such as IV devices. For example, the substrate may include thicker or intermediate gate dielectrics in the IV device regions. Forming thicker gate dielectrics may include additional processes.

As for the gate electrode layer, it may be a silicon layer. The silicon layer, for example, may be a polysilicon layer. The thickness of the gate electrode layer may be about 700-1000 Å. Other thicknesses may also be useful. The gate electrode layer may be formed by, for example, chemical vapor deposition (CVD). Other techniques for forming the gate electrode layer may also be useful. The gate electrode layer can be formed as an amorphous or non-amorphous layer. In the case of an amorphous layer, an annealing process may be performed to form a polycrystalline silicon layer.

Other types of gate dielectric and gate electrode materials or thicknesses may also be useful. For example, the gate dielectric material may be a high k dielectric material while the gate electrode may be a metal gate electrode material. Other configurations of gate layers may also be useful. For example, the gate dielectric and/or gate electrode layers may have multiple layers. The layers can be formed by various techniques, such as thermal oxidation, CVD and sputtering.

In FIG. 2h, the gate layers are patterned to form gates 160 in the first and second device regions. An etch mask may be employed to pattern the gate layers to form the gates. For example, a soft mask, such as a photoresist layer, may be used. An exposure source may selectively expose the photoresist layer through a reticle containing the desired pattern. After selectively exposing the photoresist layer, it is developed to form openings corresponding to locations where the gate layers are to be removed. To improve lithographic resolution, an anti-reflective coating (ARC) may be used below the photoresist layer.

An anisotropic etch, such as reactive ion etch (ME) is performed using the etch mask to pattern the gate layers to form the gates. Other types of etch processes may also be useful. In one embodiment, an ME is employed to pattern the gate layers to form the gates 160, each having a gate electrode 164 over a gate dielectric 162.

Referring to FIG. 2i, the process continues to form first polarity type extension regions 155 in the first device region. Forming the extension regions may include mask and implant techniques. For example, a patterned implant mask (not shown) is provided on the substrate. The implant mask exposes the first device region. An implant is performed to form the extension regions. The implant forms AHG LDD extension regions adjacent to the gate in the first device region. The implant forms extension regions having a dopant concentration of about $1E17/cm^3$ and a depth of about 50 nm. Other dopant concentrations and depths may also be useful. In one embodiment, the implant forms LDD extension regions which are the same as IV extension regions. For example, the implant mask is the same implant mask used to form first polarity type IV extension regions for first polarity type IV transistors. The implant mask is removed after forming the extension regions.

In FIG. 2j, the process continues by forming second polarity type extension regions 155 in the second device region. Forming the extension regions may include mask and implant techniques. The implant forms AHG LDD extension regions adjacent to the gate in the second device region. The implant forms extension regions having a dopant concentration of about $1E17/cm^3$ and a depth of about 50 nm. Other dopant concentrations and depths may also be useful. In one embodiment, the implant forms LDD extension regions which are the same as the IV extension regions. For example, the implant mask is the same implant mask used to form second polarity type IV extension regions for second polarity type IV transistors. The implant mask is removed after forming the extension regions.

As shown in FIG. 2k, a dielectric spacer layer 268 is formed on the substrate. The dielectric layer, for example, may be a silicon oxide layer. Other types of dielectric material, such as silicon nitride, may also be used. The dielectric layer may be formed by CVD. The dielectric layer may also be formed using other techniques. The thickness of the dielectric layer may be, for example, 100-1000 Å. Other thicknesses for the dielectric layer may also be useful. The thickness, for example, may depend on the desired width of the spacers. An anisotropic etch, such as RIE, may be performed to remove horizontal portions of the dielectric layer, leaving spacers on the sidewalls of the gate, as shown in FIG. 2l. In some applications, the spacers may be formed from multiple dielectric layers.

Referring to FIG. 2m, first polarity type main S/D regions 157 are formed in the first device region. Mask and implant techniques may be employed to form the main S/D regions in the first device region. For example, a mask exposing the first device region is used for the implant. The implant forms heavily doped main S/D regions in the device region. The dopant concentration of the main S/D region may be about $1E20/cm^3$. The main S/D regions may have a depth of about 200 nm. Other dopant concentrations and depths for the main S/D regions may also be useful. In one embodiment, the mask also exposes a portion of the second device region in which a first polarity type well contact 272 is formed. The mask may be the same mask used to form first polarity type main S/D regions and first polarity type well contacts. After forming the main S/D regions and well contacts, the implant mask is removed. The implant mask may be removed by, for example, ashing. Other techniques for removing the implant mask may also be useful.

In FIG. 2n, second polarity type main S/D regions 157 are formed in the second device region. Mask and implant techniques may be employed to form the main S/D regions in the second device region. For example, a mask exposing the second device region is used for the implant. The implant forms heavily doped main S/D regions in the device region. The dopant concentration of the main S/D region may be about $1E20/cm^3$. The main S/D regions may have a depth of about 200 nm. Other dopant concentrations and depths for the main S/D regions may also be useful. In one embodiment, the mask also exposes a portion of the second device region in which a second polarity type well contact 272 is formed. The mask may be the same mask used to form second polarity type main S/D regions and first polarity type well contacts. After forming the main S/D regions and well contacts, the implant mask is removed. Although the extension and main S/D regions, as described, are formed in a specific implant sequence, it is understood that other implant sequences may be used. For example second polarity type regions may be formed prior to first polarity type regions.

After forming the S/D regions, an annealing process, such as rapid thermal anneal (RTA), may be performed to activate the dopants in the S/D regions. The inner edges of the doped regions, for example, may extend under the dielectric spacers due to diffusion of the dopants from the doped regions.

The process continues to form the device. The processing may include forming metal silicide contacts, a pre-metal dielectric (PMD) layer and contacts to the terminals of the cell as well as one or more interconnect levels, final passivation, dicing, assembly and packaging. Other processes may also be included. For example, other components, such as low voltage, medium voltage, and high voltage I/O devices can be formed prior to forming the interconnections.

As described, the gates are formed using a gate first process. Alternatively, the gates may be formed using a gate last process. In a gate last process, dummy gates are first formed, as described. After formation of S/D regions, a dielectric layer may be formed and planarized to expose the gates. The gates are selectively removed and "real" gates are formed in the trenches resulting in a removal of the dummy gates. Gate last processes may be employed for forming metal gates or other types of gates. Forming the metal gates or other types of gates using a gate first process may also be useful.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method comprising:
   forming a first device region, a second device region, and a third device region on a substrate;
   forming a first device well in the first device region using a first masked ion implantation process and a second masked ion implantation process;
   forming an analog high gain transistor using the first device region;
   forming a low voltage transistor using the second device region; and
   forming an intermediate voltage transistor using the third device region,
   wherein the analog high gain transistor includes a first gate with a first gate dielectric on the first device region and a first gate electrode over the first gate dielectric, the low voltage transistor includes a second gate with a second gate dielectric on the second device region and a second gate electrode over the second gate dielectric, the intermediate voltage transistor includes a third gate with a third gate dielectric on the third device region and a third gate electrode over the third gate dielectric, the first gate dielectric of the analog high gain transistor is a first section of a gate dielectric material, the second gate dielectric of the low voltage transistor is a second section of the gate dielectric material, the first gate dielectric of the analog high gain transistor and the second gate dielectric of the low voltage transistor are thinner than the third gate dielectric of the intermediate voltage transistor, the intermediate voltage transistor and the analog high gain transistor have respective lightly doped extension regions with equal dopant concentrations, the low voltage transistor has a lightly doped extension region with a higher dopant concentration than the lightly doped extension regions of the intermediate voltage transistor and the analog high gain transistor, the first device well has a dopant concentration that is greater than a dopant concentration of a second device well in the second device region, and the dopant concentration of the first device well is greater than a dopant concentration of a third device well in the third device region.

2. The method of claim 1 wherein the gate dielectric material is formed by oxidation.

3. The method of claim 1 wherein the respective lightly doped extension regions of the intermediate voltage transistor and the analog high gain transistor are formed by a third implantation process.

4. The method of claim 1 wherein the first gate dielectric and the second gate dielectric are about 20 angstroms thick.

5. The method of claim 1 wherein the third gate dielectric is about 60 angstroms thick.

6. The method of claim 1 wherein the first gate electrode, the second gate electrode, and the third gate electrode comprise polysilicon, and the first gate dielectric, the second gate dielectric, and the third gate dielectric comprise silicon oxide.

7. The method of claim 1 wherein the first gate electrode, the second gate electrode, and the third gate electrode comprise a metal, and the first gate dielectric, the second gate dielectric, and the third gate dielectric comprise a high-k gate dielectric.

8. The method of claim 1 wherein the low voltage transistor has a smaller channel length than the analog high gain transistor.

9. The method of claim 1 wherein the dopant concentration of the first device well is about $1.5E16/cm^3$.

* * * * *